US012117507B2

(12) United States Patent
Endo et al.

(10) Patent No.: US 12,117,507 B2
(45) Date of Patent: Oct. 15, 2024

(54) MAGNETIC SENSOR AND METHOD FOR MANUFACTURING MAGNETIC SENSOR

(71) Applicant: SHOWA DENKO K.K., Tokyo (JP)

(72) Inventors: Daizo Endo, Ichihara (JP); Tatsunori Shino, Ichihara (JP); Akira Sakawaki, Ichihara (JP); Sho Tonegawa, Ichihara (JP); Yasumasa Watanabe, Ichihara (JP)

(73) Assignee: Resonac Corporation, Tokyo (JP)

( * ) Notice: Subject to any disclaimer, the term of this patent is extended or adjusted under 35 U.S.C. 154(b) by 215 days.

(21) Appl. No.: 17/784,889

(22) PCT Filed: Nov. 17, 2020

(86) PCT No.: PCT/JP2020/042697
§ 371 (c)(1),
(2) Date: Jun. 13, 2022

(87) PCT Pub. No.: WO2021/131400
PCT Pub. Date: Jul. 1, 2021

(65) Prior Publication Data
US 2023/0009139 A1    Jan. 12, 2023

(30) Foreign Application Priority Data

Dec. 27, 2019   (JP) .................... 2019-239497

(51) Int. Cl.
*G01R 33/06*    (2006.01)
(52) U.S. Cl.
CPC ................. *G01R 33/063* (2013.01)

(58) Field of Classification Search
CPC ...... G01R 33/063; G01R 33/06; G01R 33/00; G01R 33/0011; G01R 33/02; G01R 33/09;
(Continued)

(56) References Cited
U.S. PATENT DOCUMENTS 5,838,154 A   11/1998 Morikawa et al.
6,466,012 B1  10/2002 Mouri et al.
(Continued)

FOREIGN PATENT DOCUMENTS

JP   08-320362 A   12/1996
JP   10-319103 A   12/1998
(Continued)

OTHER PUBLICATIONS

International Search Report of PCT/JP2020/042697 dated Feb. 9, 2021 [PCT/ISA/210].

*Primary Examiner* — Son T Le
(74) *Attorney, Agent, or Firm* — Sughrue Mion, PLLC

(57) ABSTRACT

A magnetic sensor includes: plural sensitive elements 31 each including a soft magnetic material layer 105 having a longitudinal direction and a transverse direction and a conductor layer having higher conductivity than the soft magnetic material layer 105 and extending through the soft magnetic material layer 105 in a longitudinal direction, the sensitive element 31 having uniaxial magnetic anisotropy in a direction intersecting the longitudinal direction and being configured to sense a magnetic field by a magnetic impedance effect; and a connecting portion 32 continuous with the conductor layer of the sensitive element and configured to connect transversely adjacent sensitive elements 31 in series.

5 Claims, 10 Drawing Sheets

(58) Field of Classification Search
CPC .... G01R 33/091; G01R 33/093; G01D 5/245; H01L 43/00; G01P 3/488
See application file for complete search history.

(56) References Cited

U.S. PATENT DOCUMENTS

2007/0164734 A1* 7/2007 Shimizu ................ G01D 5/145
324/207.21
2010/0148771 A1* 6/2010 Ueda ..................... G01R 33/07
324/249

FOREIGN PATENT DOCUMENTS

| | | | |
|---|---|---|---|
| JP | 2000-019034 A | 1/2000 | |
| JP | 2000-284028 A | 10/2000 | |
| JP | 2002-176210 A | 6/2002 | |
| JP | 2008-249406 A | 10/2008 | |
| JP | 2009-031263 A | 2/2009 | |
| WO | WO-2018230116 A1 * | 12/2018 | ......... G01R 33/0052 |

* cited by examiner

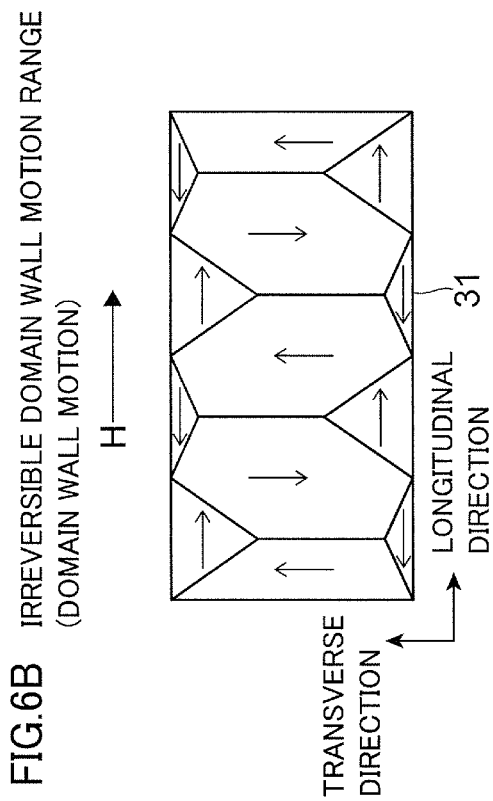
FIG.6A INITIAL PERMEABILITY RANGE (CLOSURE MAGNETIC DOMAIN)
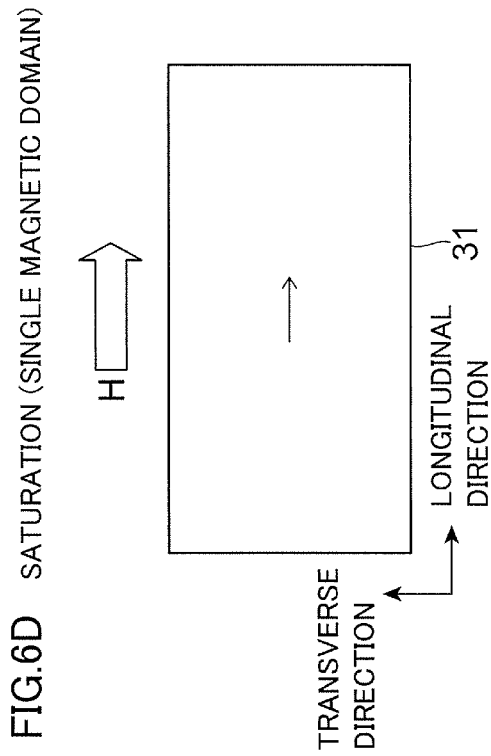
FIG.6B IRREVERSIBLE DOMAIN WALL MOTION RANGE (DOMAIN WALL MOTION)
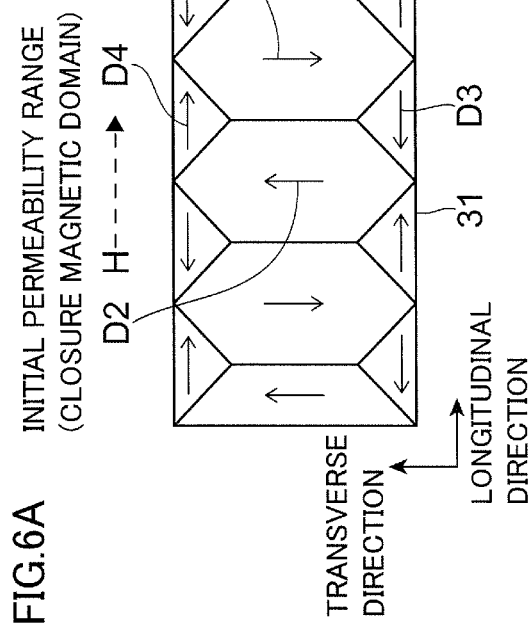
FIG.6C ROTATION MAGNETIZATION RANGE (MAGNETIZATION ROTATION)
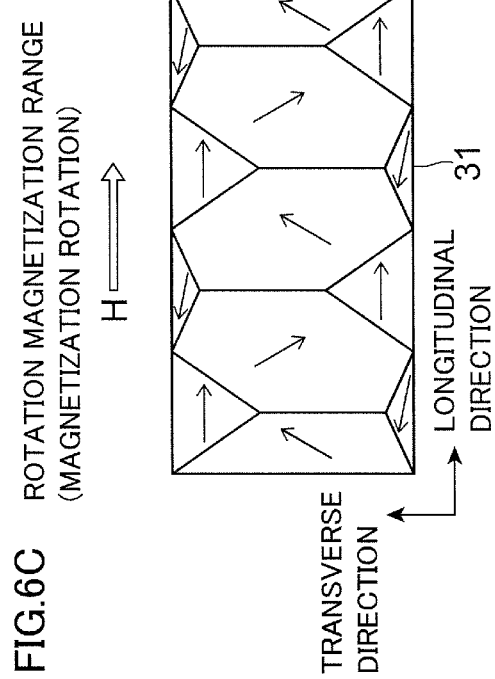
FIG.6D SATURATION (SINGLE MAGNETIC DOMAIN)

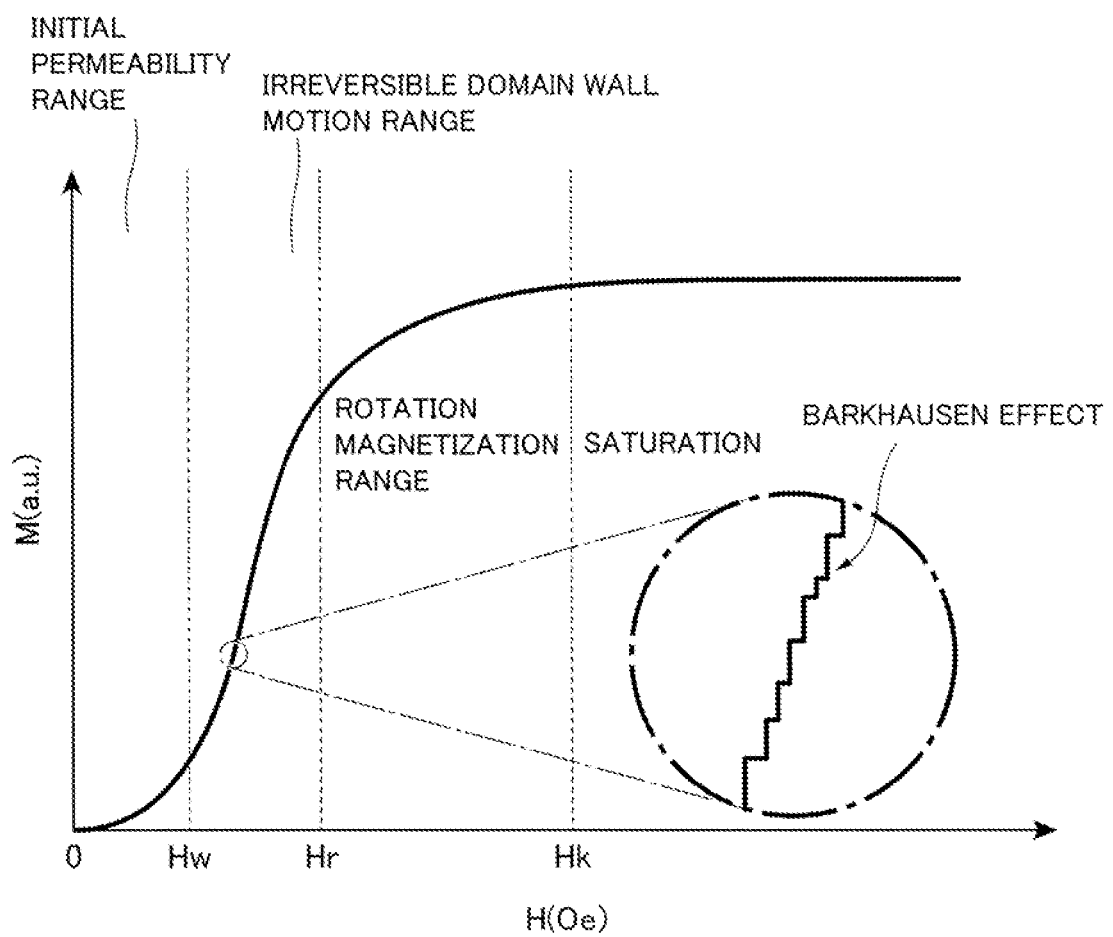

FIG.8A
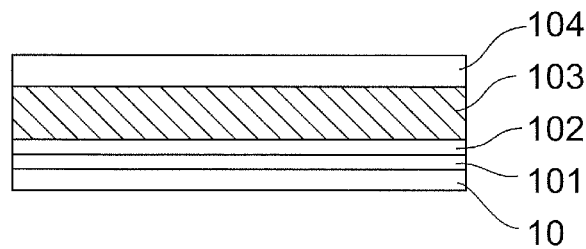
FIG.8B
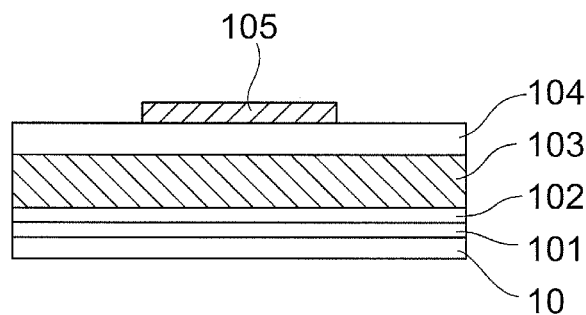
FIG.8C
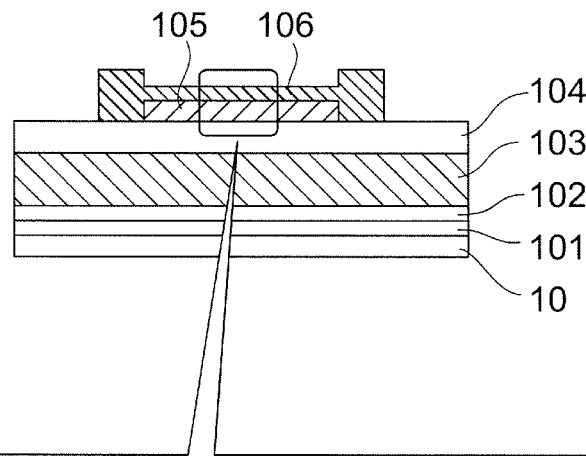
(C-1)
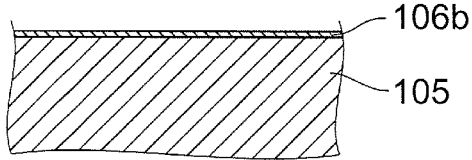
(C-3)
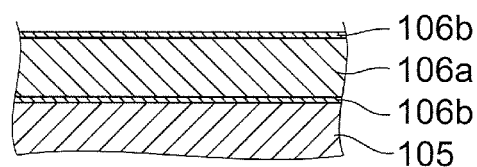
(C-2)
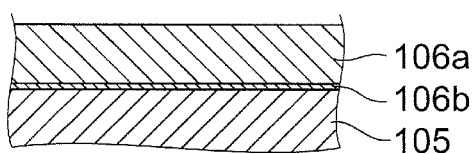

MAGNETIC SENSOR AND METHOD FOR MANUFACTURING MAGNETIC SENSOR

CROSS REFERENCE TO RELATED APPLICATIONS

This application is a National Stage of International Application No. PCT/JP2020/042697 filed on Nov. 17, 2020, claiming priority based on Japanese Patent Application No. 2019-239497 filed on Dec. 27, 2019.

TECHNICAL FIELD

The present invention relates to a magnetic sensor and a method for manufacturing a magnetic sensor.

BACKGROUND ART

A previous publication in the art discloses a magnetic impedance effect element including: a thin-film magnet composed of a hard magnetic material film formed on a non-magnetic substrate; an insulating layer covering the thin-film magnet; and a magneto-sensitive portion formed on the insulating layer and composed of one or more rectangular soft magnetic material films with uniaxial anisotropy (see Patent Document 1).

CITATION LIST

Patent Literature

Patent Document 1: Japanese Patent Application Laid-Open Publication No. 2008-249406

SUMMARY OF INVENTION

Technical Problem

A magnetic sensor that employs, as a magnetic impedance effect element, a sensitive element including a soft magnetic material layer may suffer a reduction in an SN ratio, which represents a ratio between signal and noise at the output from the magnetic sensor, depending on a laminate structure of the sensitive element.

It is an object of the present invention to reduce or inhibit a decrease in the SN ratio at the output of the magnetic sensor that uses the magnetic impedance effect.

Solution to Problem

According to an aspect of the present invention, a magnetic sensor is provided. The magnetic sensor includes: plural sensitive elements, each of the plural sensitive elements including a soft magnetic material layer having a longitudinal direction and a transverse direction and a conductor layer having higher conductivity than the soft magnetic material layer and extending through the soft magnetic material layer in the longitudinal direction, each of the plural sensitive elements having uniaxial magnetic anisotropy in a direction intersecting the longitudinal direction, each of the plural sensitive elements being configured to sense a magnetic field by a magnetic impedance effect; and a connecting portion continuous with the conductor layer of one of the plural sensitive elements and configured to connect transversely adjacent ones of the plural sensitive elements in series.

The soft magnetic material layer of each of the plural sensitive elements may be formed with a magnetic domain having magnetization oriented in a circumferential direction centered about the conductor layer.

Each of the plural sensitive elements may further include a diffusion inhibiting layer between the conductor layer and the soft magnetic material layer, the diffusion inhibiting layer being configured to inhibit diffusion of elements between the conductor layer and the soft magnetic material layer.

The connecting portion may include a connecting conductor layer and a connecting diffusion inhibiting layer, the connecting conductor layer being continuous with the conductor layer of the one of the plural sensitive elements, the connecting diffusion inhibiting layer being continuous with the diffusion inhibiting layer of the one of the plural sensitive elements.

The diffusion inhibiting layer of each of the plural sensitive elements may be disposed around a perimeter of the conductor layer centered about an axis of the longitudinal direction.

According to another aspect of the present invention, a method for manufacturing a magnetic sensor is provided. The method includes: forming plural first soft magnetic material portions using a soft magnetic material, each of the plural first soft magnetic material portions being strip-shaped and having a longitudinal direction and a transverse direction; concurrently forming plural conductor portions and a connecting portion using a material with higher conductivity than the soft magnetic material, the plural conductor portions being formed on respective ones of the plural first soft magnetic material portions so as to extend in the longitudinal direction, the connecting portion being configured to connect adjacent ones of the plural conductor portions; and forming plural second soft magnetic material portions using the soft magnetic material, the plural second soft magnetic material portions being formed above respective ones of the plural first soft magnetic material portions so as to cover respective ones of the plural conductor portions.

Each of the plural conductor portions and the connecting portion may be formed by sequential deposition of a conductor layer and a diffusion inhibiting layer, the conductor layer having higher conductivity than the soft magnetic material, the diffusion inhibiting layer being configured to inhibit diffusion of elements between the conductor layer and the soft magnetic material.

Advantageous Effects of Invention

The present invention can reduce or inhibit a decrease in the SN ratio at the output of the magnetic sensor that uses the magnetic impedance effect.

BRIEF DESCRIPTION OF DRAWINGS

FIGS. 6A-6D illustrate relationship between strength of a magnetic field H applied to the sensitive element of a conventional magnetic sensor and changes in magnetic domains in the sensitive element.

FIG. 7 illustrates relationship between strength of a magnetic field applied to the sensitive element and magnetization strength in the sensitive element.

FIGS. 8A-8C illustrate an example method for manufacturing the magnetic sensor.

DESCRIPTION OF EMBODIMENTS

Exemplary embodiments of the present invention will be described below with reference to the attached drawings.

Figure 1A:
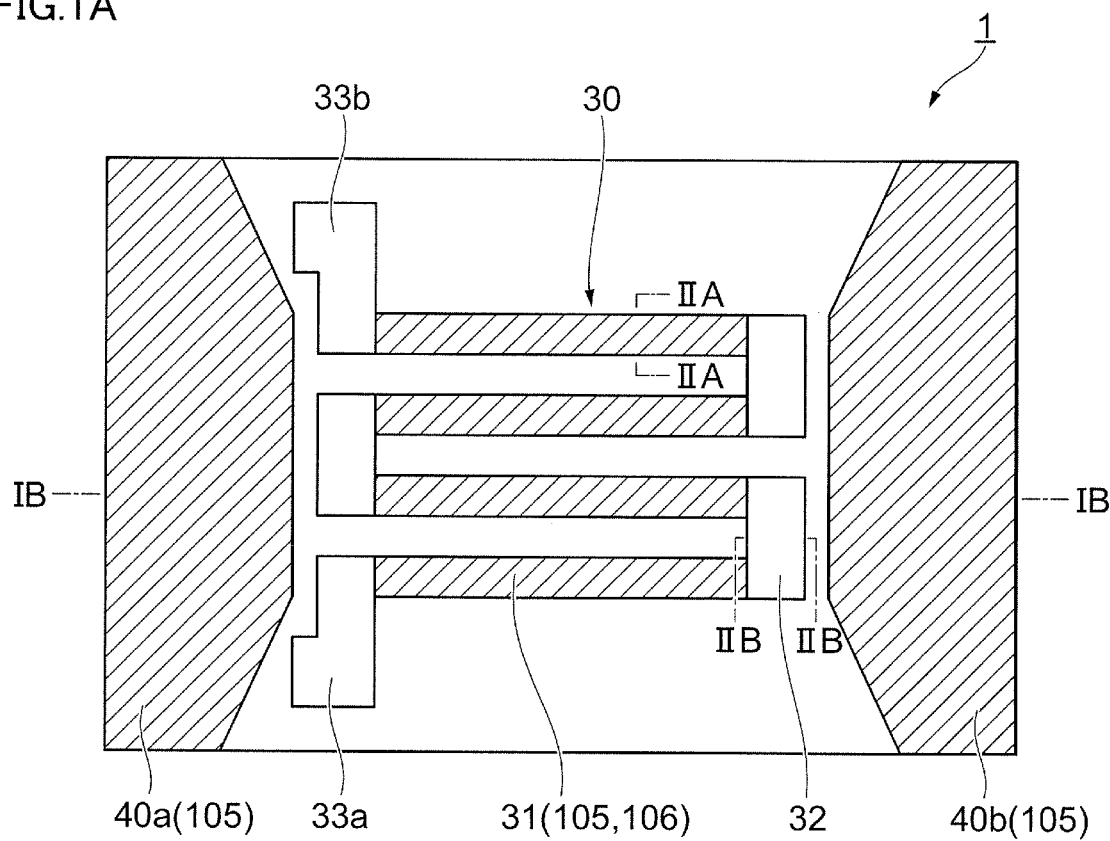
FIGS. 1A and 1B illustrate an example magnetic sensor according to an embodiment.
Figure 1B:
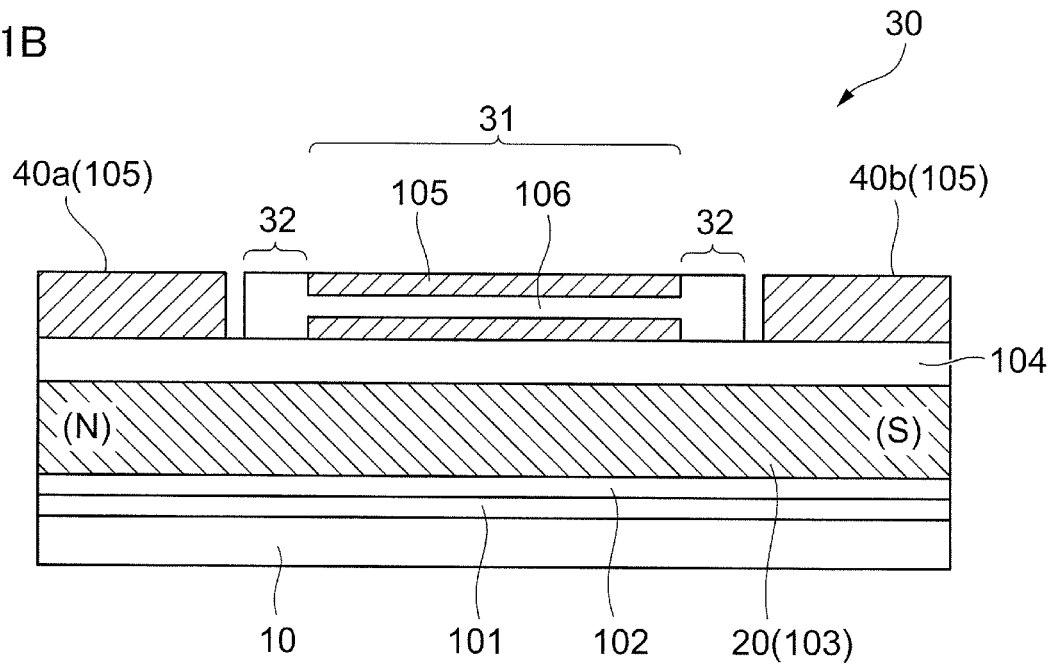

FIGS. 1A and 1B illustrate an example magnetic sensor 1 according to an embodiment; FIG. 1A is a plan view of the magnetic sensor 1, and FIG. 1B is a cross-sectional view along the line IB-IB in FIG. 1A.

As shown in FIG. 1B, the magnetic sensor 1 according to the present embodiment includes a thin-film magnet 20 disposed on a non-magnetic substrate 10 and made of a hard magnetic material (hard magnetic material layer 103), and a sensitive portion 30 laminated to face the thin-film magnet 20 and comprises a soft magnetic material (soft magnetic material layer 105) to sense a magnetic field.

A cross-sectional structure of the magnetic sensor 1 will be detailed in subsequent paragraphs.

The hard magnetic material refers to a so-called high coercivity material that, once being magnetized by an external magnetic field, keeps its magnetized state even after removal of the external magnetic field. The soft magnetic material refers to a so-called low coercivity material that is easily magnetizable by an external magnetic field but quickly returns to a non-magnetized or low magnetized state upon removal of the external magnetic field.

Herein, elements constituting the magnetic sensor 1 (e.g., thin-film magnet 20) is denoted by two-digit reference numerals, and layers processed into these elements (e.g., hard magnetic material layer 103) are denoted by reference numerals in the 100s. And the reference numeral for each layer processed into a corresponding element may be placed in parentheses following the reference numeral for the corresponding element. For example, the thin-film magnet 20 is denoted as "the thin-film magnet 20 (hard magnetic material layer 103)". In the figures, the reference numerals are presented as "20(103)". This holds for other elements.

Referring to FIG. 1A, a planar structure of the magnetic sensor 1 is described. By way of example, the magnetic sensor 1 has a square planar shape. Here, a description is given of the sensitive portion 30 and yokes 40 formed in the uppermost part of the magnetic sensor 1.

The sensitive portion 30 includes: plural sensitive elements 31, connecting portions 32 connecting respective adjacent sensitive elements 31 in series in a serpentine pattern, and terminal portions 33 connected with electric wires for electric current supply. In the sensitive portion 30 of the magnetic sensor 1 shown in FIG. 1A, four sensitive elements 31 are arranged such that their longitudinal directions are parallel to each other. These sensitive elements 31 are magnetic impedance effect elements. As detailed in subsequent paragraphs, each sensitive element 31 of the present embodiment includes a soft magnetic material layer 105 and a conductor portion 106 extending through the soft magnetic material layer 105 in the longitudinal direction.

Each sensitive element 31 has, for example, a longitudinal length of from 1 mm to 2 mm and a transversal width of from 50 μm to 150 μm. A distance between adjacent sensitive elements 31 is from 50 μm to 150 μm. Preferably, the transversal width of each sensitive element 31 is smaller than the distance between adjacent sensitive elements 31.

Each connecting portion 32 is disposed between ends of respective adjacent sensitive elements 31 to connect the respective adjacent sensitive elements 31 in series in a serpentine pattern. As the magnetic sensor 1 shown in FIG. 1A includes four sensitive elements 31 arranged in parallel, there are three connecting portions 32. The number of connecting portions 32 varies depending on the number of sensitive elements 31. For example, when there are three sensitive elements 31, two connecting portions 32 will be provided. The width of the connecting portion 32 may be set according to factors such as the height of pulsed voltage applied by a voltage applicator to the sensitive portion 30. For example, the width of the connecting portion 32 may be same as that of the sensitive element 31.

As detailed in subsequent paragraphs, the connecting portion 32 of the present embodiment is configured to be continuous with the conductor portion 106 of the corresponding sensitive element 31.

The terminal portions 33 are disposed at (two) respective ends of the sensitive elements 31 that are not connected with any connecting portion 32. The terminal portion 33 may have a size that allows for connection of the electric wires. Since the sensitive portion 30 of the present embodiment includes four sensitive elements 31, the two terminal portions 33 are arranged on the left side in FIG. 1A. When the sensitive elements 31 are odd in number, the two terminal portions 33 may be arranged respectively on the right and left sides.

The magnetic sensor 1 further includes the yokes 40 facing longitudinal ends of the sensitive elements 31. In this example, the magnetic sensor 1 includes two yokes 40a, 40b facing respective longitudinal ends of each sensitive element 31. Hereinafter, the yokes 40a, 40b may be simply referred to as the yokes 40 unless the distinction is necessary. The yokes 40 induce magnetic lines of force to the longitudinal ends of the sensitive elements 31. Hence, the yokes 40 are made of a soft magnetic material (soft magnetic material layer 105) that easily transmits the magnetic lines of force. Note that the yokes 40 may be eliminated when the magnetic lines of force can sufficiently pass through the sensitive elements 31 in the longitudinal direction thereof.

From the above, the magnetic sensor 1 is several millimeters square in planar shape. Note that the size of the magnetic sensor 1 may be any other value.

Referring now to FIG. 1B, a cross-sectional structure of the magnetic sensor 1 is described. The magnetic sensor 1 is composed of the non-magnetic substrate 10 and a lamination of an adhesive layer 101, a control layer 102, the hard magnetic material layer 103 (the thin-film magnet 20), a dielectric layer 104, and the sensitive portion 30 and the yokes 40 including the soft magnetic material layer 105, which are arranged (laminated) in this order on the substrate 10.

The substrate 10 is made of a non-magnetic material. Examples of the substrate 10 include an oxide substrate such as glass and sapphire, a semiconductor substrate such as silicon, and a metal substrate such as aluminum, stainless steel, and a metal plated with nickel phosphorus.

The adhesive layer 101 increases adhesiveness of the control layer 102 to the substrate 10. The adhesive layer 101 may be made of an alloy containing Cr or Ni. Examples of the alloy containing Cr or Ni include CrTi, CrTa, and NiTa. The adhesive layer 101 is from 5 nm to 50 nm thick, for example. Note that the adhesive layer 101 may be eliminated when the control layer 102 has sufficient adhesiveness to the substrate 10. Also note that the composition ratio of the alloy containing Cr or Ni will not be described herein. This holds for other alloys given below.

The control layer 102 controls the magnetic anisotropy of the thin-film magnet 20, which is formed of the hard magnetic material layer 103, such that the magnetic anisotropy easily develops in an in-plane direction of the film. The control layer 102 may be made of Cr, Mo, W, or an alloy containing at least one of these metals (hereinafter referred to as an alloy containing Cr or the like constituting the control layer 102). Examples of the alloy containing Cr or the like constituting the control layer 102 include CrTi, CrMo, CrV, and CrW. The control layer 102 is from 10 nm to 300 nm thick, for example.

The hard magnetic material layer 103 constituting the thin-film magnet 20 may be a Co-based alloy containing either Cr or Pt or both (hereinafter referred to as a Co alloy constituting the thin-film magnet 20). Examples of the Co alloy constituting the thin-film magnet 20 include CoCrPt, CoCrTa, CoNiCr, and CoCrPtB. The Co alloy constituting the thin-film magnet 20 may also contain Fe. The hard magnetic material layer 103 is from 1 μm to 3 μm thick, for example.

The alloy containing Cr or the like constituting the control layer 102 has a body-centered cubic (bcc) structure. Thus, the hard magnetic material (hard magnetic material layer 103) constituting the thin-film magnet 20 preferably has a hexagonal close-packed (hcp) structure, which facilitates crystal growth on the control layer 102 composed of the alloy containing Cr or the like having the bcc structure. Such crystal growth, on the bcc structure, of the hard magnetic material layer 103 having the hcp structure can easily cause a c-axis of the hcp structure to be oriented in the in-plane direction. Consequently, the thin-film magnet 20, which is composed of the hard magnetic material layer 103, can easily have the magnetic anisotropy in the in-plane direction. Note that the hard magnetic material layer 103 has a polycrystalline structure composed of a group of differently oriented crystallites, and each crystallite has magnetic anisotropy in the in-plane direction. This magnetic anisotropy is derived from magneto-crystalline anisotropy.

To facilitate the crystal growth of the alloy containing Cr or the like constituting the control layer 102 and the Co alloy constituting the thin-film magnet 20, the substrate 10 may be heated to 100° C. to 600° C. This heating facilitates the crystal growth of the alloy containing Cr or the like constituting the control layer 102 and thus facilitates the crystal orientation of the hard magnetic material layer 103 so as to yield an easy axis of magnetization in the plane of the hard magnetic material layer 103 having the hcp structure. In other words, the heating facilitates impartation of the in-plane magnetic anisotropy to the hard magnetic material layer 103.

The dielectric layer 104 is made of a non-magnetic dielectric and provides electrical insulation between the thin-film magnet 20 and the sensitive portion 30. Examples of the dielectric constituting the dielectric layer 104 include oxides such as $SiO_2$, $Al_2O_3$ and $TiO_2$ and nitrides such as $Si_3N_4$ and AlN. The dielectric layer 104 is from 0.1 μm to 30 μm thick, for example.

Each sensitive element 31 of the sensitive portion 30 is composed of the soft magnetic material layer 105 and the conductor portion 106, which includes a conductor layer 106a and diffusion inhibiting layers 106b. Each connecting portion 32 of the sensitive portion 30 is composed of the conductor layer 106a and the diffusion inhibiting layers 106b continuous with the conductor portion 106 of the corresponding sensitive element 31.

The structures of the sensitive element 31 and the connecting portion 32 of the sensitive portion 30 are described below.

Figure 2A:
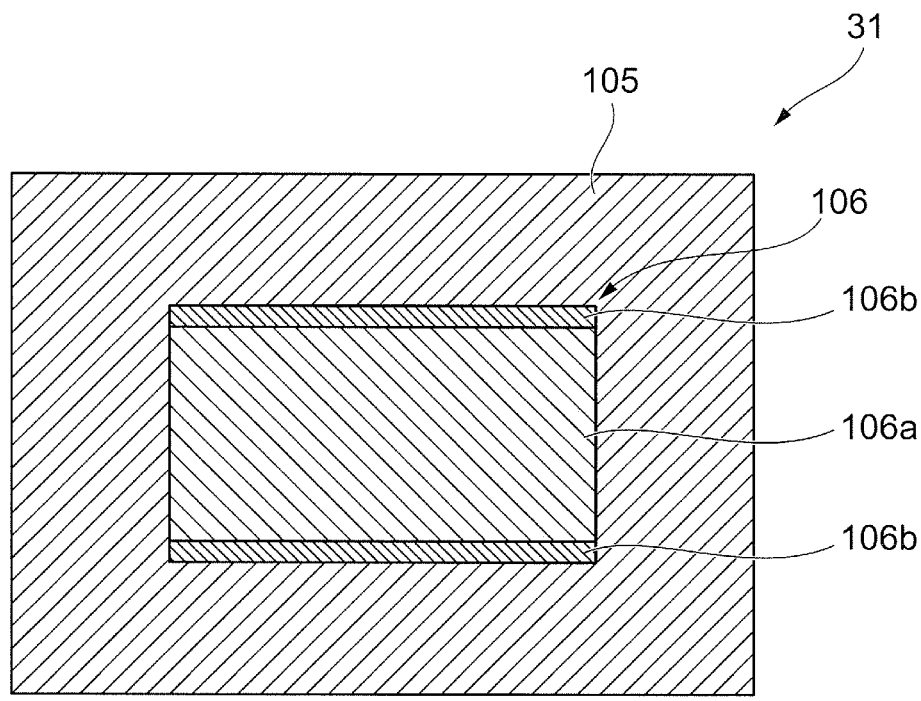
FIGS. 2A and 2B illustrate a configuration of a sensitive portion according to the present embodiment.
Figure 2B:
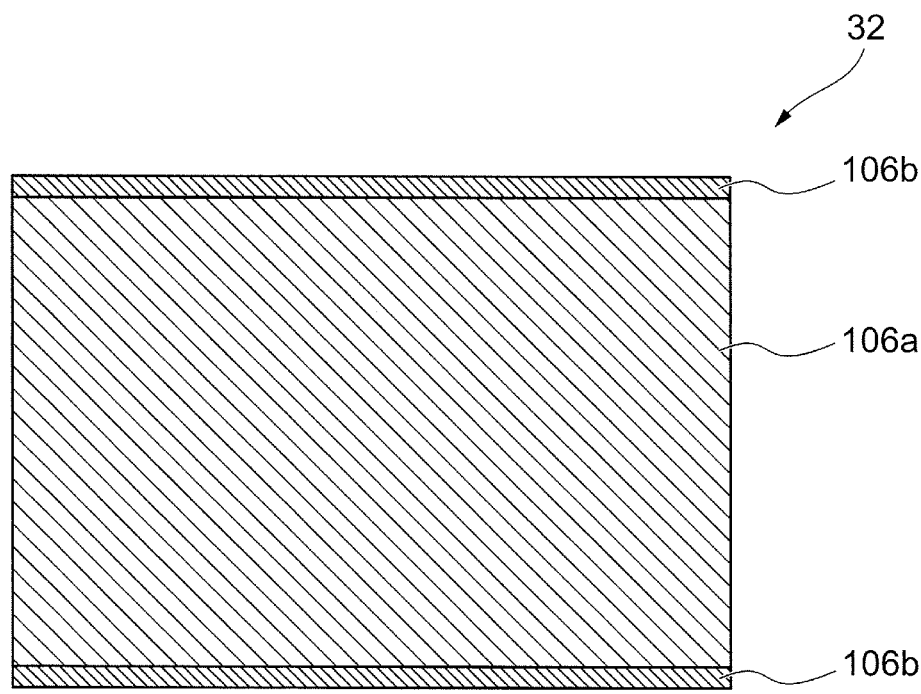
Figure 3A:
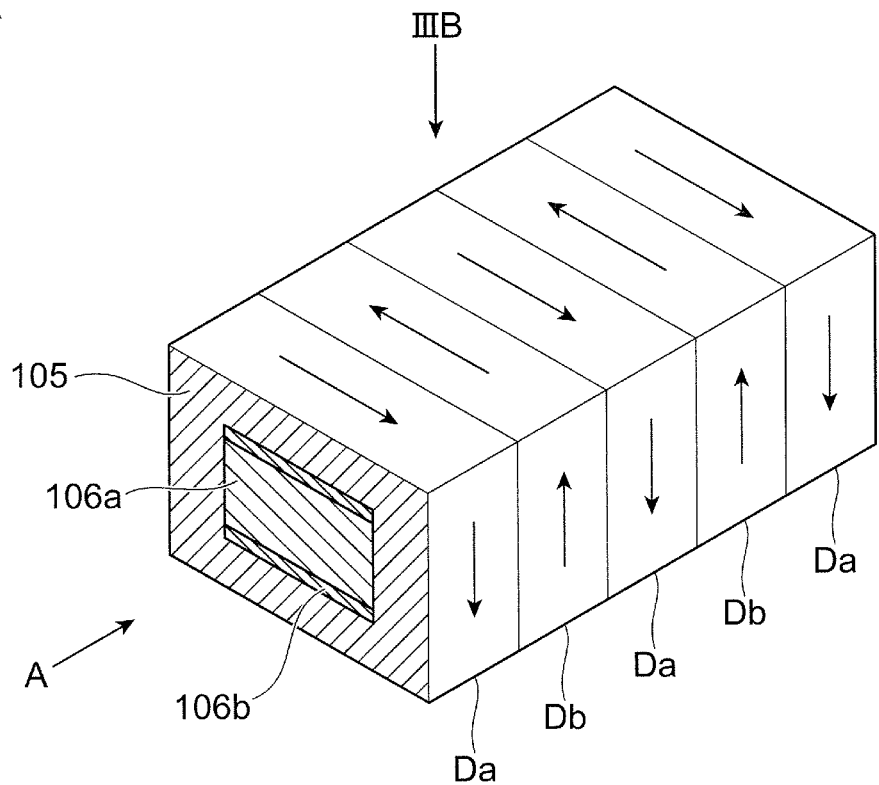
FIGS. 3A and 3B illustrate the configuration of the sensitive portion according to the present embodiment.
Figure 3B:
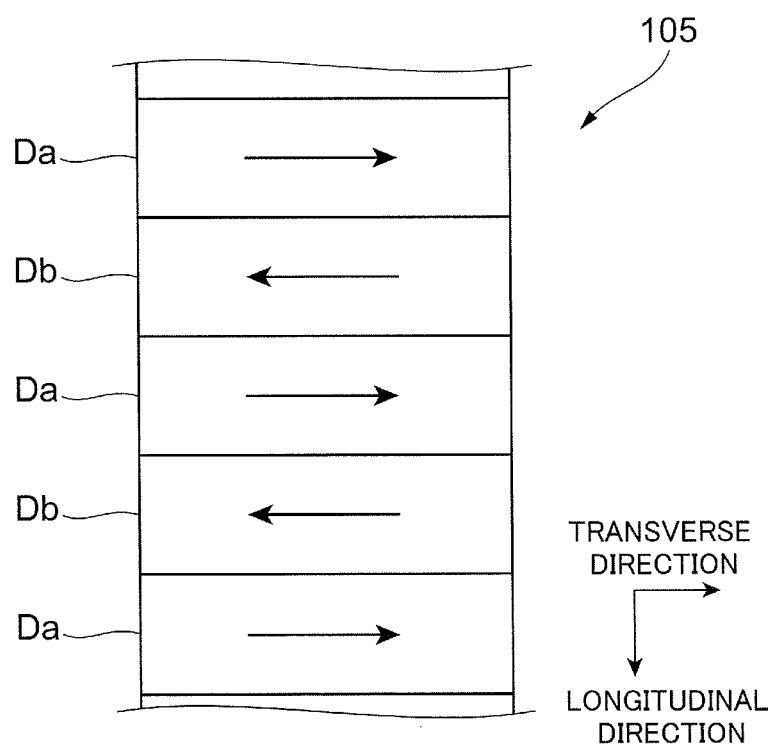

FIGS. 2A and 2B and FIGS. 3A and 3B illustrate the configuration of the sensitive portion 30 according to the present embodiment. FIG. 2A is a cross-sectional view along the line IIA-IIA in FIG. 1A, depicting a cross-section of the sensitive element 31. FIG. 2B is a cross-sectional view along the line IIB-IIB in FIG. 1A, depicting a cross-section of the connecting portion 32. FIG. 3A is a perspective view of the sensitive element 31, and FIG. 3B illustrates the sensitive element 31 as viewed in the direction of IIIB in FIG. 3A. FIGS. 3A and 3B also illustrate the magnetic domain structure formed in the soft magnetic material layer 105 of the sensitive element 31.

As shown in FIGS. 1B, 2A, and 3A, each sensitive element 31 of the present embodiment includes the soft magnetic material layer 105 formed of a strip shape extending along the longitudinal direction and also includes the conductor portion 106 extending through the soft magnetic material layer 105 in the longitudinal direction. In other words, the soft magnetic material layer 105 is provided around the perimeter of the longitudinally extending conductor portion 106 centered about the longitudinal axis thereof.

When looking at the soft magnetic material layer 105 of each sensitive element 31 alone, the soft magnetic material layer 105 has a quadrangular tube shape centered about the longitudinal axis thereof.

As shown in FIGS. 2A and 3A, the conductor portion 106 of each sensitive element 31 has the diffusion inhibiting layers 106b respectively laminated on top and bottom faces of the conductor layer 106a. In other words, the conductor portion 106 is composed of the diffusion inhibiting layer 106b, the conductor layer 106a, and the diffusion inhibiting layer 106b laminated in this order. To further illustrate, each diffusion inhibiting layer 106b of the conductor portion 106 is laminated between the conductor layer 106a and the soft magnetic material layer 105.

Preferably, the soft magnetic material layer 105 is made of a Co-based amorphous alloy doped with a high melting point metal such as Nb, Ta, or W (hereinafter referred to as a Co alloy constituting the soft magnetic material layer 105). Examples of the Co alloy constituting the soft magnetic material layer 105 include CoNbZr, CoFeTa, and CoWZr.

For example, the soft magnetic material layer 105 can have a thickness in the following range. That is, a thickness from a bottom face of the soft magnetic material layer 105 (interface between the soft magnetic material layer 105 and the dielectric layer 104) to a bottom face of the conductor portion 106, and a thickness from a top face of the conductor portion 106 to a top face of the soft magnetic material layer 105 may be each in a range from 250 nm to 750 nm. Preferably, the thickness of the soft magnetic material layer 105 from the bottom face of the soft magnetic material layer 105 to the bottom face of the conductor portion 106 and the thickness of the soft magnetic material layer 105 from the top face of the conductor portion 106 to the top face of the soft magnetic material layer 105 are equal to each other.

The conductor layer 106a of the conductor portion 106 is preferably made of a metal with higher conductivity than the soft magnetic material layer 105, and more preferably made of a highly conductive and non-magnetic metal. Specifically, the conductor layer 106a may be made of a metal such as silver, aluminum, copper, platinum, and gold. The sensitive element 31 of the present embodiment has a reduced resistance by virtue of having the conductor layer 106a.

For example, the conductor layer 106a can have a thickness in a range from 50 nm to 750 nm, where the thickness is preferably smaller than the above-described thickness of the soft magnetic material layer 105.

The diffusion inhibiting layer 106b of the conductor portion 106 inhibits the metal constituting the conductor layer 106a from diffusing into the soft magnetic material layer 105 (diffusion inhibiting function), and inhibits oxidation of the conductor layer 106a during, e.g., fabrication of the magnetic sensor 1 (oxidation inhibiting function). Any element that is more immiscible with Co of the Co alloy constituting the soft magnetic material layer 105 than the metal constituting the conductor layer 106a or any metal that is less immune to alterations in air than the metal constituting the conductor layer 106a is used as the diffusion inhibiting layer 106b. Specific example elements for the diffusion inhibiting layer 106b that are more immiscible with Co include copper, molybdenum, gold, and carbon. Specific example elements for the diffusion inhibiting layer 106b that are less immune to alterations in air include precious metals such as gold, platinum, rubidium, rhodium, rhenium, palladium, and niobium.

For example, the diffusion inhibiting layer 106b can have a thickness in a range from 1 nm to 50 nm. If the diffusion inhibiting layer 106b has a thickness of less than 1 nm, the diffusion inhibiting layer 106b may fail to fully perform the diffusion inhibiting function and the oxidation inhibiting function. If, on the other hand, the diffusion inhibiting layer 106b has a thickness of greater than 50 nm, it may cause the conductor portion 106 to fail to fully reduce the resistance of the sensitive element 31 or cause the sensitive element 31 to increase in size.

A transversal width of the conductor portion 106 is not limited to a particular value provided that the transversal width is smaller than a transversal width of the soft magnetic material layer 105 (i.e., transversal width of the sensitive element 31); for example, the transversal width of the conductor portion 106 may be about 10 μm to 100 μm.

The sensitive element 31 is provided with uniaxial magnetic anisotropy in a direction intersecting the longitudinal direction, e.g., in the transverse direction (i.e., width direction of the sensitive element 31) perpendicular to the longitudinal direction. Note that the direction intersecting the longitudinal direction may be a direction angled at 45 degrees or more with respect to the longitudinal direction.

The connecting portion 32 is composed of the conductor layer 106a and the diffusion inhibiting layers 106b continuous with the conductor portion 106. As shown in FIG. 2B, each connecting portion 32 has the diffusion inhibiting layer 106b, the conductor layer 106a, and the diffusion inhibiting layer 106b laminated in this order. Though not illustrated herein, the terminal portion 33 is also composed of the conductor layer 106a and the diffusion inhibiting layers 106b continuous with the conductor portion 106. Note that the portion of the conductor layer 106a constituting the connecting portion 32 corresponds to the connecting conductor layer, and the portion of the diffusion inhibiting layer 106b constituting the connecting portion 32 corresponds to the connecting diffusion inhibiting layer.

Oxidation of the conductor layer 106a is inhibited by virtue of the connecting portion 32 and the terminal portion 33 having the diffusion inhibiting layers 106b.

In the magnetic sensor 1 of the present embodiment, the connecting portion 32, the terminal portion 33, and the conductor portion 106 of the sensitive element 31 are integrally composed of the conductive conductor layer 106a and the diffusion inhibiting layers 106b. This allows the magnetic sensor 1 to pass electric current from one terminal portion 33 to the other terminal portion 33 via the plural sensitive elements 31 and connecting portions 32.

Returning to FIGS. 1A and 1B, the adhesive layer 101, the control layer 102, the hard magnetic material layer 103, and the dielectric layer 104 are processed to have a square planar shape (see FIG. 1). Two opposing exposed sides of the thin-film magnet 20 are the north pole ((N) in FIG. 1B) and the south pole ((S) in FIG. 1B). A line connecting the north and south poles of the thin-film magnet 20 is oriented in the longitudinal direction of the sensitive element 31 of the sensitive portion 30. The phrase "oriented in the longitudinal direction" means that the line connecting the north and south poles is angled at 45 degrees or less with respect to the longitudinal direction. The smaller the angle between the line connecting the north and south poles and the longitudinal direction, the better.

In the magnetic sensor 1, magnetic lines of force emanating from the north pole of the thin-film magnet 20 once exit from the magnetic sensor 1. Then, some of the magnetic lines of force pass through the sensitive elements 31 via the yoke 40a and again exit from the magnetic sensor 1 via the yoke 40b. Thus, the magnetic lines of force having passed through the sensitive elements 31 return to the south pole of the thin-film magnet 20 together with other magnetic lines of force that have not passed through the sensitive elements 31. In other words, the thin-film magnet 20 applies a magnetic field (bias magnetic field Hb described below) in the longitudinal direction of the sensitive elements 31.

Note that the north and south poles of the thin-film magnet 20 are hereinafter collectively referred to as "both magnetic poles", and each of the north and south poles is hereinafter referred to as a "magnetic pole" unless the distinction is necessary.

As shown in FIG. 1A, when viewed from the top side of the substrate 10, each of the yokes 40 (yokes 40a, 40b) has a shape that narrows as it approaches the sensitive portion 30. This shape is intended to concentrate the magnetic field (gather the magnetic lines of force) at the sensitive portion 30. In other words, this shape helps further improve the sensitivity by enhancing the magnetic field at the sensitive portion 30. Note that the yokes 40 (yokes 40a, 40b) are not necessarily narrowed at the portions thereof facing the sensitive portion 30.

A distance between each of the yokes 40 (yokes 40a, 40b) and the sensitive portion 30 may be from 1 μm to 100 μm, for example.

(Functions of the Magnetic Sensor 1)

Figure 4:
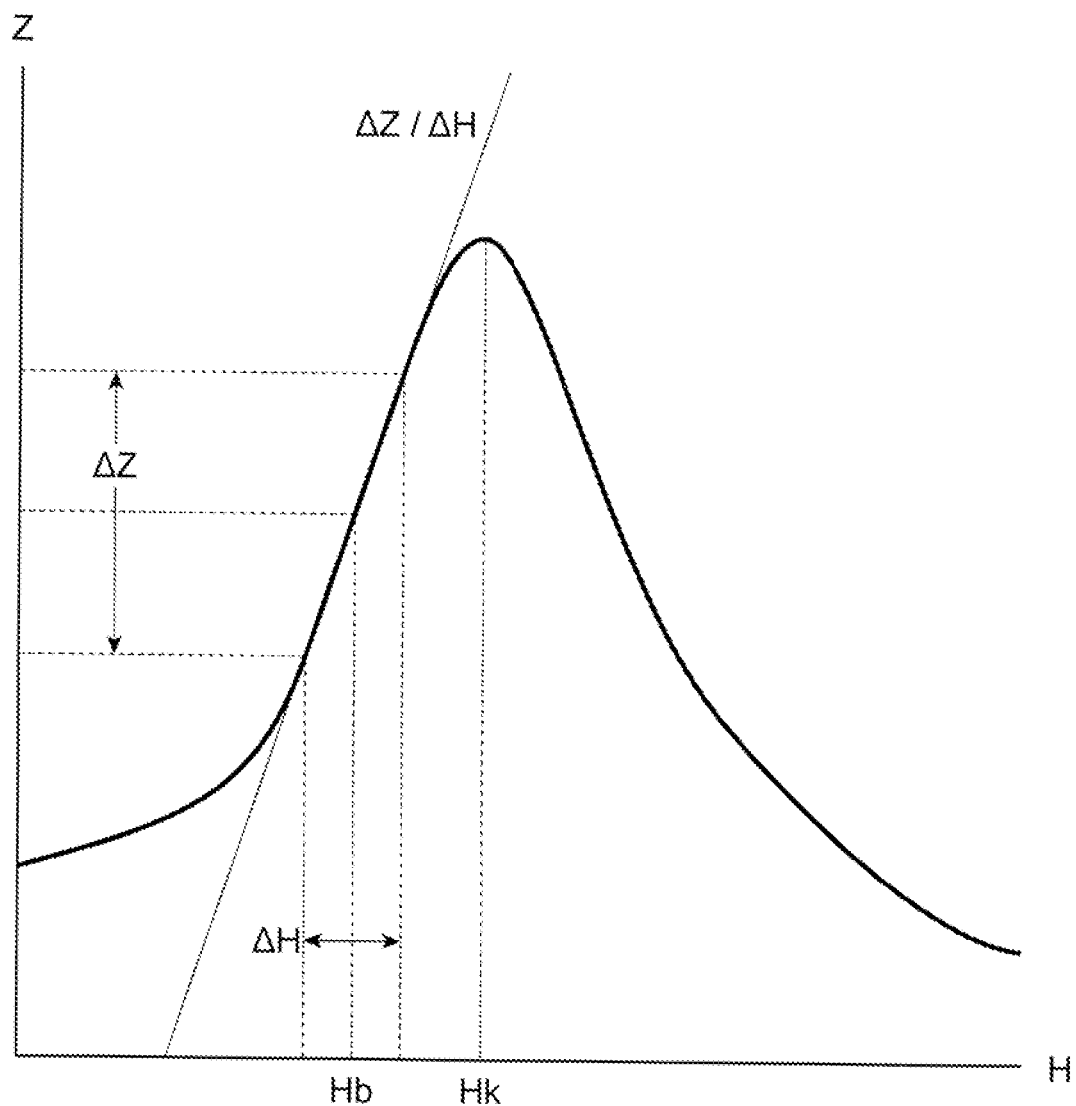
FIG. 4 illustrates relationship between a magnetic field applied in a longitudinal direction of a sensitive element in the sensitive portion of the magnetic sensor and an impedance of the sensitive portion.

Functions of the magnetic sensor 1 are now described. FIG. 4 illustrates relationship between a magnetic field applied in the longitudinal direction of the sensitive element 31 in the sensitive portion 30 of the magnetic sensor 1 and an impedance of the sensitive portion 30. In FIG. 4, the horizontal axis represents the magnetic field H, and the vertical axis represents the impedance Z. The impedance Z of the sensitive portion 30 is measured by passing a high-frequency current between the two terminal portions 33.

As shown in FIG. 4, the impedance Z of the sensitive portion 30 increases with increase in the magnetic field H applied in the longitudinal direction of the sensitive element 31. By use of a portion where an amount of change ΔZ in the impedance Z relative to an amount of change ΔH in the magnetic field H is steep (i.e., a portion where ΔZ/ΔH is large) within the region where the applied magnetic field H is smaller than an anisotropic magnetic field Hk of the sensitive element 31, a slight change in the magnetic field H can be extracted as the amount of change ΔZ in the impedance Z. In FIG. 4, the center of the portion of the magnetic field H where the ΔZ/ΔH is large is denoted as a magnetic field Hb. That is, the amount of change in the magnetic field H (ΔH) near the magnetic field Hb (in the region indicated by the arrowed line in FIG. 4) can be measured with high accuracy. The magnetic field Hb may also be called a bias magnetic field.

(Possible Problems Encountered by Conventional Magnetic Sensors)

Figure 5:
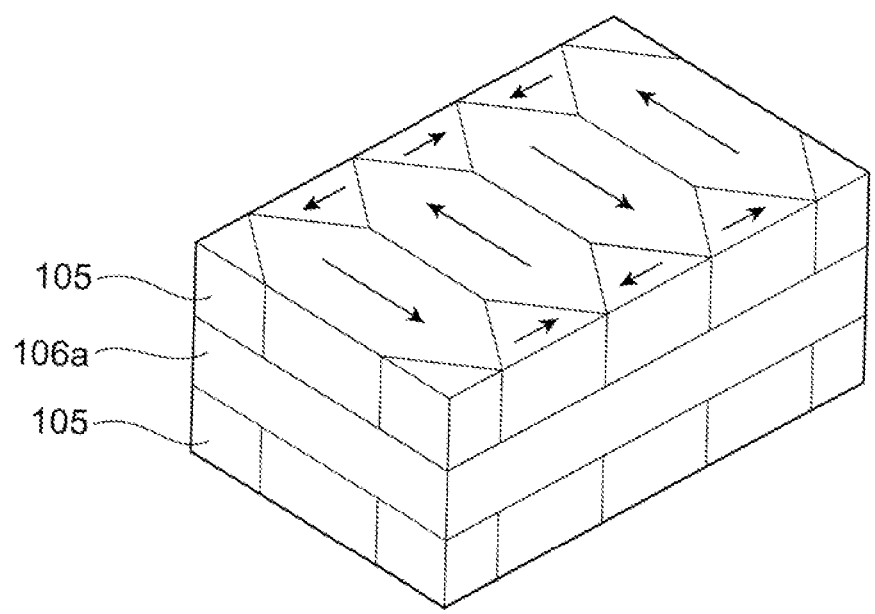
FIG. 5 illustrates an example configuration of a conventional sensitive element, showing a perspective view of the conventional sensitive element.

A conventional magnetic sensor including the sensitive element 31 as a magnetic impedance effect element may be provided with the conductor layer 106a, which has higher conductivity than the soft magnetic material layer 105, in the sensitive element 31 in order to reduce the resistance of the sensitive element 31 and improve the sensitivity of the magnetic sensor. FIG. 5 illustrates an example configuration of a conventional sensitive element 31, showing a perspective view thereof. FIG. 5 also illustrates a magnetic domain structure formed in the soft magnetic material layer 105 of the sensitive element 31.

The conventional sensitive element 31 shown in FIG. 5 is composed of a lamination of two soft magnetic material layers 105 and a single conductor layer 106a therebetween.

In this manner, providing the conductor layer 106a can reduce the resistance of the conventional sensitive element 31. However, the conventional magnetic sensor including the conventional sensitive element 31 shown in FIG. 5 may experience a decrease in the SN ratio, which represents a ratio between signal and noise at the output from the magnetic sensor. Presumably, this is because a closure magnetic domain (details described below) with a circular magnetization orientation is formed within the plane of the soft magnetic material layer 105 as shown in FIG. 5, and domain walls constituting this closure magnetic domain move along with changes in the magnetic field H near the magnetic field Hb.

This phenomenon of the SN ratio reduction in the magnetic sensor caused by the closure magnetic domain formed in the sensitive element 31 is detailed below.

FIGS. 6A-6D illustrate relationship between strength of the magnetic field H applied to the sensitive element 31 of the conventional magnetic sensor and changes in magnetic domains in the sensitive element 31. Here, it is assumed that uniaxial magnetic anisotropy is already imparted to the sensitive element 31 in the transverse direction thereof in an initial state where the magnetic field H is 0.

FIG. 6A illustrates an example magnetic domain structure of the sensitive element 31 in the state where the magnetic field H is very weak and near 0 (referred to as an "initial permeability range," which is detailed below). FIG. 6B illustrates an example magnetic domain structure of the sensitive element 31 in the state where the magnetic field H is stronger than the state shown in FIG. 6A (referred to as an "irreversible domain wall motion range," which is detailed below). FIG. 6C illustrates an example magnetic domain structure of the sensitive element 31 in the state where the magnetic field H is stronger than the state shown in FIG. 6B (referred to as a "rotation magnetization range," which is detailed below). FIG. 6D illustrates an example magnetic domain structure of the sensitive element 31 in the state where the magnetic field H is stronger than the state shown in FIG. 6C (referred to as "saturation," which is detailed below).

FIG. 7 illustrates relationship between the strength of the magnetic field applied to the sensitive element 31 and the magnetization strength in the sensitive element 31. In FIG. 7, the horizontal axis represents the magnetic field H (Oe), and the vertical axis represents the magnetization M (a.u.). FIG. 7 also shows relationship of these magnetic field H and magnetization M with respect to the initial permeability range, the irreversible magnetic domain wall motion range, the rotation magnetization range, and the saturation described above.

The external magnetic field H applied to the sensitive element 31 ranging from 0 to a domain wall motion magnetic field Hw (details given below) is referred to as the "initial permeability range."

In the initial permeability range, plural magnetic domains with different orientations of the magnetization M are formed in the sensitive element 31. More specifically, the sensitive element 31 includes: a first magnetic domain D1 and a second magnetic domain D2 with the magnetization M oriented in the direction of the easy axis of magnetization (transverse direction); and a third magnetic domain D3 and a fourth magnetic domain D4 with the magnetization M oriented in the direction of the hard axis of magnetization (longitudinal direction). The first magnetic domain D1 and the second magnetic domain D2 are opposite each other, and the third magnetic domain D3 and the fourth magnetic domain D4 are also opposite each other. These four magnetic domains are arranged in a clockwise direction in the figure, circularly from the first magnetic domain D1 to the third magnetic domain D3 to the second magnetic domain D2 to the fourth magnetic domain D4 to the first magnetic domain D1. As a result, these four magnetic domains collectively form a closure magnetic domain with a circular orientation of the magnetization M.

Macroscopically, the sensitive element 31 includes plural closure magnetic domains arranged in the longitudinal direction. In each closure magnetic domain, each area of the first magnetic domain D1 and the second magnetic domain D2 extending along the easy axis of magnetization is larger than each area of the third magnetic domain D3 and the fourth magnetic domain D4 extending along the hard axis of magnetization, based on the above relationship between the easy axis of magnetization and the hard axis of magnetization.

In the initial permeability range, the magnetic domains constituting each closure magnetic domain remain constant relative to changes in the magnetic field H. In other words, when the magnetic field H is in the range from 0 to the domain wall motion magnetic field Hw, the magnetic domain structure shown in FIG. 6A remains unchanged even with an increase in the magnetic field H.

The external magnetic field H applied to the sensitive element 31 ranging from the domain wall motion magnetic field Hw to a magnetization rotation magnetic field Hr (details given below) is referred to as the "irreversible domain wall motion range."

Once the magnetic field H exceeds the domain wall motion magnetic field Hw, which is determined based on characteristics (such as material, structure, and dimensions)

of the soft magnetic material layer 105 constituting the sensitive element 31, domain wall motion occurs in each closure magnetic domain, whereby positions of domain walls between respective adjacent magnetic domains move due to the effect of the magnetic field H. During this motion, in each closure magnetic domain, domain walls between the forth magnetic domain D4 with the same orientation of the magnetization M as the magnetic field H and the first and second magnetic domains D1, D2 adjacent to the fourth magnetic domain D4 move such that the area of the fourth magnetic domain D4 increases. Also, domain walls between the third magnetic domain D3 with an opposite orientation of the magnetization M from the magnetic field H and the first and second magnetic domains D1, D2 adjacent to the third magnetic domain D3 move such that the area of the third magnetic domain D3 decreases. As a result, the area of the fourth magnetic domain D4 increases as compared to that in the initial permeability range shown in FIG. 6A, and the areas of the remaining first to third magnetic domains D1-D3 decrease as compared to those in the initial permeability range.

The motion of the domain walls in the irreversible domain wall motion range occurs discontinuously along with an increase in the magnetic field H. As a result, the magnetization M of the sensitive element 31 as a whole relative to the magnetic field H changes stepwise (in a jagged fashion), rather than in a linear or curved fashion, as indicated by an enlarged portion in FIG. 7. This relationship between the magnetic field H and the magnetization M is called Barkhausen effect.

In the irreversible domain wall motion range, area ratios of the magnetic domains constituting each closure magnetic domain continue to gradually change relative to changes in the magnetic field H. More specifically, when the magnetic field H is in the range from the domain wall motion magnetic field Hw to the magnetization rotation magnetic field Hr, the area of the fourth magnetic domain D4 gradually increases while the areas of the first to third magnetic domains D1-D3 gradually decrease along with an increase in the magnetic field H.

The external magnetic field H ranging from the magnetization rotation magnetic field Hr to the anisotropic magnetic field Hk is referred to as the "rotation magnetization range."

Once the magnetic field H exceeds the magnetization rotation magnetic field Hr, which is determined based on characteristics (such as material, structure, and dimensions) of the soft magnetic material layer 105 constituting the sensitive element 31, magnetization rotation occurs in each closure magnetic domain, whereby the orientation of the magnetization M in each of the first to third magnetic domains D1-D3 that has been oriented different from the magnetic field H gradually rotates such that it is oriented in the same direction as the magnetic field H, while positions of the domain walls between adjacent magnetic domains are substantially fixed. During this rotation, the fourth magnetic domain D4 remains unchanged because its magnetization orientation is already aligned with the orientation of the magnetic field H.

In the rotation magnetization range, while the areas of the magnetic domains constituting each closure magnetic domain have little changes relative to changes in the magnetic field H, the orientation of the magnetization M in the first to third magnetic domains D1-D3 continues to gradually change. More specifically, when the magnetic field H is in the range from the magnetization rotation magnetic field Hr to the anisotropic magnetic field Hk, the orientation of the magnetization M of the fourth magnetic domain D4 does not change along with an increase in the magnetic field H but the orientation of the magnetization M of the remaining first to third magnetic domains D1-D3 gradually rotates such that it is aligned with the orientation of the magnetic field H.

However, in the rotation magnetization range, the orientation of the magnetization M of the first to third magnetic domains D1-D3 rotates continuously. Thus, in the rotation magnetization range, the changes in the magnetization M of the sensitive element 31 as a whole relative to the magnetic field H exhibit a curved form as shown in FIG. 7. In the rotation magnetization range, the rate of increase in the magnetization M of the sensitive element 31 as a whole relative to the increase in the magnetic field H slows down as the magnetic field H increases, and becomes substantially flat near the anisotropic magnetic field Hk, where the magnetization M takes a maximum value.

The region where the externally applied magnetic field H exceeds the anisotropic magnetic field Hk is referred to as the "saturation."

Once the magnetic field H exceeds the above anisotropic magnetic field Hk, the orientation of the magnetization M in each closure magnetic domain is aligned with the orientation of the magnetic field H, i.e., the orientation of the magnetization M of the fourth magnetic domain D4. As a result, domain walls that have been present between adjacent magnetic domains disappear, resulting in the sensitive element 31 having only one (single) magnetic domain.

Upon saturation, the magnetization M of the sensitive element 31 as a whole will no longer change relative to the changes in the magnetic field H and will take a substantially constant value due to the change in the magnetic domain structure from having plural closure magnetic domains to having a single magnetic domain.

Typically, a region where the amount of change $\Delta Z$ in the impedance Z relative to the amount of change $\Delta H$ in the magnetic field H is large is set for magnetic sensors. This region corresponds to the irreversible domain wall motion range. In the irreversible domain wall motion range, the formation of the closure magnetic domain in the soft magnetic material layer 105 of the sensitive element 31 generates the Barkhausen effect along with changes in the magnetic field H, whereby domain walls constituting the closure magnetic domain move discontinuously in a stepwise fashion. Presumably, this discontinuous motion of the domain walls in the sensitive element 31 produces noise, causing a decrease in the SN ratio at the output from the magnetic sensor.

Hence, it is preferred to avoid the formation of the closure magnetic domain in the sensitive element 31 in order to reduce noise caused by the discontinuous domain wall motion and reduce a decrease in the SN ratio at the output from the magnetic sensor.

Magnetic Domain Structure of the Sensitive Element 31 of the Present Embodiment In contrast, as described above, the magnetic sensor 1 of the present embodiment is configured such that the sensitive element 31 includes the conductor portion 106 extending through the soft magnetic material layer 105 in the longitudinal direction. This helps prevent the formation of a closure magnetic domain in the sensitive element 31.

The magnetic domain structure of the sensitive element 31 of the present embodiment shown in FIGS. 3A and 3B is described below.

As shown in FIG. 3A, the soft magnetic material layer 105 of the quadrangular tube shape in the sensitive element 31 of the present embodiment is formed with plural magnetic domains Da, Db arranged in the longitudinal direction and each surrounding the perimeter of the conductor layer 106a. To further illustrate, the soft magnetic material layer 105 is formed with plural magnetic domains Da and plural magnetic domains Db having different orientations of the magnetization M and alternately arranged in the longitudinal direction.

In each of the magnetic domains Da, Db, the magnetization M is oriented in a circumferential direction centered about the longitudinal axis. More specifically, when viewed in the direction of arrow A in FIG. 3A, the magnetization M is oriented in the clockwise direction in the magnetic domain Da. In the magnetic domain Db adjacent to the magnetic domain Da, the magnetization M is oriented in the counterclockwise direction.

In the soft magnetic material layer 105 of the present embodiment, each of the magnetic domains Da, Db has a circular orientation of the magnetization M, as opposed to the plural magnetic domains (e.g., the first to fourth magnetic domains D1-D4; see FIG. 6A etc.) collectively having a circular orientation of the magnetization M as a closure magnetic domain.

This reduces the number of domain walls formed in the soft magnetic material layer 105 of the sensitive element 31 of the present embodiment, as compared to when the soft magnetic material layer 105 has a closure magnetic domain. This, in turn, reduces noise that may otherwise be caused by discontinuous domain wall motion and thus reduces a decrease in the SN ratio at the output from the magnetic sensor 1.

(Method for Manufacturing the Magnetic Sensor 1)

An example method for manufacturing the magnetic sensor 1 is now described. FIGS. 8A-8C and FIGS. 9D-9F illustrate an example method for manufacturing the magnetic sensor 1. Note that the steps shown in FIGS. 8A-8C and FIGS. 9D-9F are representative steps and proceed from FIG. 8A through FIG. 9F. Also note that FIGS. 8A-8C and FIGS. 9D-9F correspond to the cross-sectional view shown in FIG. 1B.

As described above, the substrate 10 is a substrate made of a non-magnetic material, examples of which include an oxide substrate such as glass and sapphire, a semiconductor substrate such as silicon, and a metal substrate such as aluminum, stainless steel, and a metal plated with nickel phosphorus. The substrate 10 may be formed with linear grooves or linear protrusions and recesses with a curvature radius Ra of e.g., from 0.1 nm to 100 nm by means of a polishing machine or the like. The direction of these linear grooves or linear protrusions and recesses may be aligned with the direction connecting the north and south poles of the thin-film magnet 20 composed of the hard magnetic material layer 103. This facilitates the crystal growth in the hard magnetic material layer 103 in the direction of the grooves. This in turn helps to cause the easy axis of magnetization of the thin-film magnet 20 composed of the hard magnetic material layer 103 to be oriented in the direction of the grooves (direction connecting the north and south poles of the thin-film magnet 20). In other words, the thin-film magnet 20 can be magnetized more easily.

By way of example, the substrate 10 discussed herein is assumed to be glass with a diameter of about 95 mm and a thickness of about 0.5 mm. In the case where the magnetic sensor 1 is several millimeters square in planar shape, multiple magnetic sensors 1 are manufactured in a batch on the substrate 10 and then divided (cut) into individual magnetic sensors 1.

After cleaning of the substrate 10, the adhesive layer 101, the control layer 102, the hard magnetic material layer 103, and the dielectric layer 104 are deposited (stacked) in this order on one side (hereinafter referred to as a "top side") of the substrate 10 to thereby form a laminate thereon, as shown in FIG. 8A.

First, the adhesive layer 101 of the alloy containing Cr or Ni, the control layer 102 of the alloy containing Cr or the like, and the hard magnetic material layer 103 of the Co alloy constituting the thin-film magnet 20 are successively deposited (stacked) in this order. This deposition may be done by a sputtering method or the like. The substrate 10 is moved to successively face multiple targets made of respective materials, whereby the adhesive layer 101, the control layer 102, and the hard magnetic material layer 103 are laminated in this order on the substrate 10. As described above, the substrate 10 may be heated to e.g., 100° C. to 600° C. during formation of the control layer 102 and the hard magnetic material layer 103 to facilitate the crystal growth.

The substrate 10 may or may not be heated during the deposition of the adhesive layer 101. The substrate 10 may be heated prior to the deposition of the adhesive layer 101 to remove moisture or the like adhering to the top side of the substrate 10.

Then, the dielectric layer 104, which is e.g., an oxide such as $SiO_2$, $Al_2O_3$ and $TiO_2$ or a nitride such as $Si_3N_4$ and AlN, is deposited (stacked). The deposition of the dielectric layer 104 may be done by a plasma CVD method, a reactive sputtering method, or the like.

A photoresist pattern (resist pattern) is formed using any known photolithography technique. The resist pattern includes openings at positions where the sensitive elements 31 of the sensitive portion 30 are to be formed.

Subsequently, the Co alloy constituting the soft magnetic material layer 105 of the sensitive element 31 is deposited (stacked), as shown in FIG. 8B. The soft magnetic material layer 105 can be deposited using a sputtering method, for example.

Then, the resist pattern is removed, and also the soft magnetic material layer 105 on the resist pattern is removed (lifted off). As a result, the soft magnetic material layer 105 as an example of the first soft magnetic material portion is formed on the dielectric layer 104.

Then, a photoresist pattern (resist pattern) is formed using any known photolithography technique. This resist pattern includes openings at respective positions where the sensitive elements 31, the connecting portions 32, and the terminal portions 33 of the sensitive portion 30 are to be formed. In the present embodiment, each opening in this resist pattern at which the sensitive element 31 is to be formed has a transversal width that is smaller than a transversal width of the soft magnetic material layer 105 formed in FIG. 8B.

Then, the conductor layer 106a and the diffusion inhibiting layers 106b are deposited (stacked) to form the conductor portion 106 of the sensitive element 31 as well as the connecting portion 32 and the terminal portion 33, as shown in FIG. 8C.

Specifically, as shown in FIG. 8C-1, the diffusion inhibiting layer 106b is first deposited.

Then, as shown in FIG. 8C-2, the conductor layer 106a is deposited on the diffusion inhibiting layer 106b. The metal constituting the conductor layer 106a, such as silver and aluminum, by its nature readily diffuses into the Co alloy constituting the soft magnetic material layer 105. In the present embodiment, the diffusion inhibiting layer 106b is deposited on the soft magnetic material layer 105 shown in FIG. 8B prior to the deposition of the conductor layer 106a. As shown in FIG. 8C-2, this prevents direct lamination of the conductor layer 106a onto the soft magnetic material layer 105, inhibiting diffusion of the metal constituting the conductor layer 106a into the soft magnetic material layer 105.

Then, as shown in FIG. 8C-3, the diffusion inhibiting layer 106b is deposited on the conductor layer 106a.

The deposition of the conductor layer 106a and the diffusion inhibiting layers 106b shown in FIGS. 8C-1 to 8C-3 can be performed by a sputtering method, for example. When depositing the conductor layer 106a and the diffusion inhibiting layers 106b using a sputtering method, it is preferred that the deposition of the conductor layer 106a shown in FIG. 8C-2 and the deposition of the diffusion inhibiting layer 106b shown in FIG. 8C-3 be performed sequentially without removing the substrate 10 from the sputtering apparatus. The metal constituting the conductor layer 106a is prone to oxidation by air. Depositing the diffusion inhibiting layer 106b on the conductor layer 106a sequentially following the deposition of the conductor layer 106a prevents a top face of the conductor layer 106a from being exposed to air, thereby inhibiting oxidation of the conductor layer 106a.

Then, the resist pattern is removed, and also the conductor layer 106a and the diffusion inhibiting layer 106b on the resist pattern are removed, resulting in the formation of the conductor portion 106 of the sensitive element 31 as well as the connecting portion 32 and the terminal portion 33 (see FIG. 1A), as shown in FIG. 8C.

Then, a photoresist pattern (resist pattern) is formed using any known photolithography technique. This resist pattern includes openings at positions where the sensitive elements 31 of the sensitive portion 30 are to be formed. Here, each opening in this resist pattern at which the sensitive element 31 is to be formed has a transversal width that is equal to the transversal width of the soft magnetic material layer 105 formed in FIG. 8B.

Figure 9D:
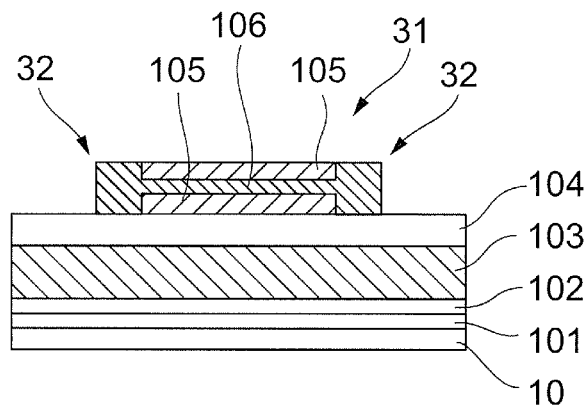
FIGS. 9D-9F illustrate the example method for manufacturing the magnetic sensor.

Subsequently, the Co alloy constituting the soft magnetic material layer 105 of the sensitive element 31 is deposited (stacked) as shown in FIG. 9D. Specifically, the soft magnetic material layer 105 is deposited to cover side and top faces of the conductor portion 106 formed in FIG. 8C. The soft magnetic material layer 105 can be deposited using a sputtering method, for example.

As described above, the conductor portion 106 includes the diffusion inhibiting layer 106b deposited on the top face of the conductor layer 106a. This inhibits diffusion of the metal constituting the conductor layer 106a into the soft magnetic material layer 105 even when the soft magnetic material layer 105 is deposited on the top face of the conductor portion 106 in FIG. 9D.

Thereafter, the resist pattern is removed, and also the soft magnetic material layer 105 on the resist pattern is removed (lifted off). As a result, the soft magnetic material layer 105 as an example of the second soft magnetic material portion is formed, resulting in the formation of the sensitive element 31 having the conductor portion 106 extending through the soft magnetic material layer 105 in the longitudinal direction.

Then, a photoresist pattern (resist pattern) is formed using any known photolithography technique. This resist pattern includes openings at positions where the yokes 40 are to be formed.

Thus, the Co alloy constituting the soft magnetic material layer 105 is deposited (stacked).

Figure 9E:
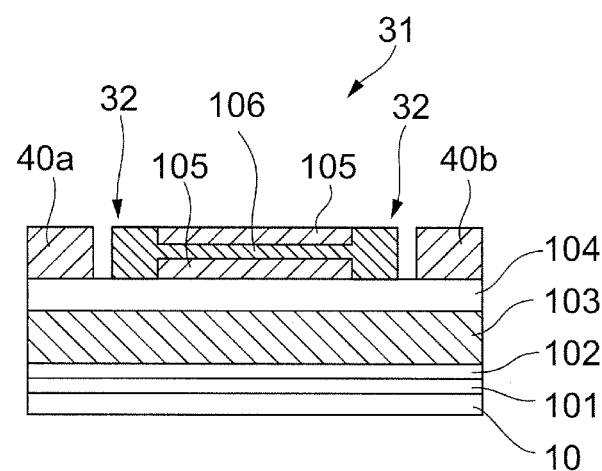

Thereafter, the resist pattern is removed, and also the soft magnetic material layer 105 on the resist pattern is removed (lifted off). This results in the formation of the yokes 40 composed of the soft magnetic material layer 105, as shown in FIG. 9E.

Thereafter, the soft magnetic material layer 105 constituting the sensitive element 31 is provided with uniaxial magnetic anisotropy in the width direction (transverse direction) of the sensitive elements 31 of the sensitive portion 30 (see FIG. 1A). This impartation of the uniaxial magnetic anisotropy to the soft magnetic material layer 105 can be done by, for example, heat treatment at 400° C. in a rotating magnetic field of 3 kG (0.3 T) (heat treatment in a rotating magnetic field) and subsequent heat treatment at 400° C. in a static magnetic field of 3 kG (0.3 T) (heat treatment in a static magnetic field). At this time, similar uniaxial magnetic anisotropy is imparted to the soft magnetic material layer 105 constituting the yokes 40. However, the yokes 40 may not be provided with the uniaxial magnetic anisotropy because the yokes 40 are only required to serve as a magnetic circuit.

Figure 9F:
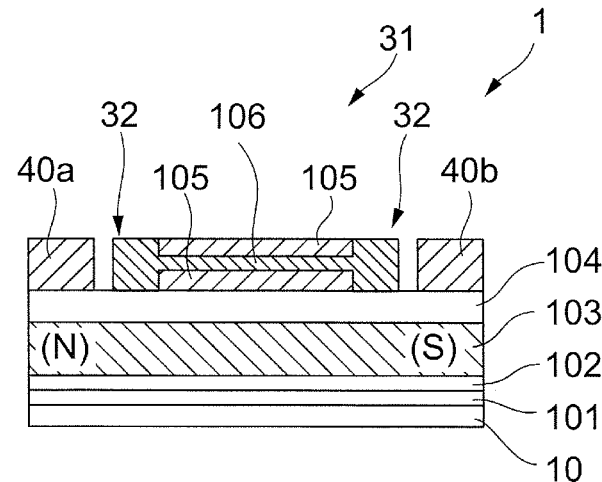

Then, as shown in FIG. 9F, the hard magnetic material layer 103 constituting the thin-film magnet 20 is magnetized. This magnetization of the hard magnetic material layer 103 can be done by applying a magnetic field larger than a coercive force of the hard magnetic material layer 103 in a static magnetic field or a pulsed magnetic field until the magnetization of the hard magnetic material layer 103 is saturated.

Subsequently, multiple magnetic sensors 1 formed on the substrate 10 are divided (cut) into individual magnetic sensors 1. In other words, the substrate 10, the adhesive layer 101, the control layer 102, the hard magnetic material layer 103, the dielectric layer 104, and the soft magnetic material layer 105 are cut such that each magnetic sensor 1 has a square planar shape as shown in the plan view of FIG. 1A. This results in the magnetic poles (north pole and south pole) of the thin-film magnet 20 being exposed on respective lateral sides of the divided (cut) hard magnetic material layer 103. Thus, the magnetized hard magnetic material layer 103 becomes the thin-film magnet 20. This division (cutting) can be done by a dicing method, a laser cutting method, or the like.

Note that an etching step of removing portions of the adhesive layer 101, the control layer 102, the hard magnetic material layer 103, the dielectric layer 104, and the soft magnetic material layer 105 between adjacent magnetic sensors 1 on the substrate 10 so as to shape these layers into a square planar shape (planar shape of the magnetic sensor 1 shown in FIG. 1) may take place before the step of dividing the multiple magnetic sensors 1 into individual magnetic sensors 1. Then, the exposed substrate 10 may be divided (cut).

Still alternatively, after the step of forming the laminate, the adhesive layer 101, the control layer 102, the hard magnetic material layer 103, and the dielectric layer 104 may be processed to have a square planar shape (planar shape of the magnetic sensor 1 shown in FIG. 1).

As compared to these methods, the manufacturing method described above involves simplified steps.

The magnetic sensor 1 is thus manufactured. Note that the impartation of the uniaxial magnetic anisotropy to the soft magnetic material layer 105 and/or the magnetization of the thin-film magnet 20 may be performed for each magnetic sensor 1 or multiple magnetic sensors 1 after the step of dividing the magnetic sensors 1 into individual magnetic sensors 1.

In the absence of the control layer 102, it would be necessary to heat the hard magnetic material layer 103 to 800° C. or more after the deposition thereof to bring about crystal growth and thereby impart the in-plane magnetic anisotropy. In contrast, providing the control layer 102, as in the magnetic sensor 1 of the present embodiment, eliminates the need for bringing about such crystal growth at a high temperature of 800° C. or more because the control layer 102 can facilitate the crystal growth.

The impartation of the uniaxial magnetic anisotropy to the sensitive elements 31 may be done by a magnetron sputtering method during the stacking of the soft magnetic material layer 105, instead of the aforementioned heat treatment in the rotating magnetic field and heat treatment in the static magnetic field. The magnetron sputtering method forms a magnetic field using magnets and confines electrons generated by discharge to a surface of a target. The method thus increases the probability of collisions between the electrons and a gas to facilitate ionization of the gas, thereby increasing the film deposition rate. The magnetic field formed by the magnets used in the magnetron sputtering method imparts the uniaxial magnetic anisotropy to the soft magnetic material layer 105 concurrently with the deposition thereof. As such, the magnetron sputtering method allows omission of the step of imparting the uniaxial magnetic anisotropy through the heat treatment in the rotating magnetic field and the heat treatment in the static magnetic field.

The use of the magnetron sputtering method eliminates the need for performing a heat treatment for imparting the uniaxial magnetic anisotropy and thus inhibits diffusion of the metal constituting the conductor layer 106a into the soft magnetic material layer 105 during the fabrication of the magnetic sensor 1.

(Modifications of the Conductor Portion 106 and the Connecting Portion 32)

Modifications of the conductor portion 106 of the sensitive element 31 and the connecting portion 32 of the present embodiment are now described. In the example shown in FIGS. 2A and 2B, each of the conductor portion 106 and the connecting portion 32 is composed of the diffusion inhibiting layer 106b, the conductor layer 106a, and the diffusion inhibiting layer 106b laminated in this order; however, the structure of the conductor portion 106 and the connecting portion 32 is not limited to this.

Figure 10A:
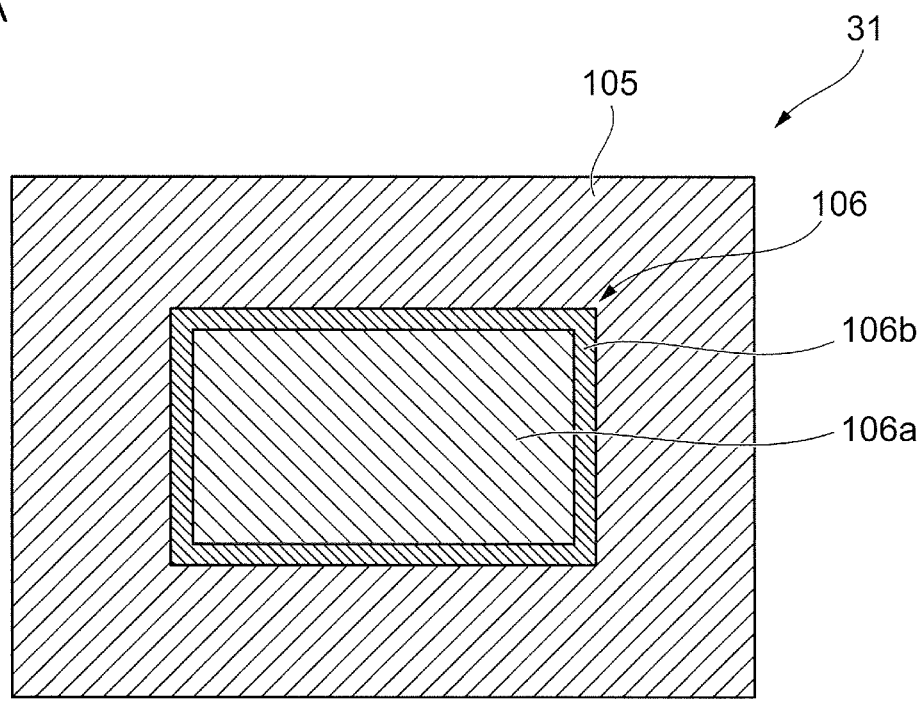
FIGS. 10A and 10B illustrate configurations of a conductor portion and a connecting portion according to another embodiment.
Figure 10B:
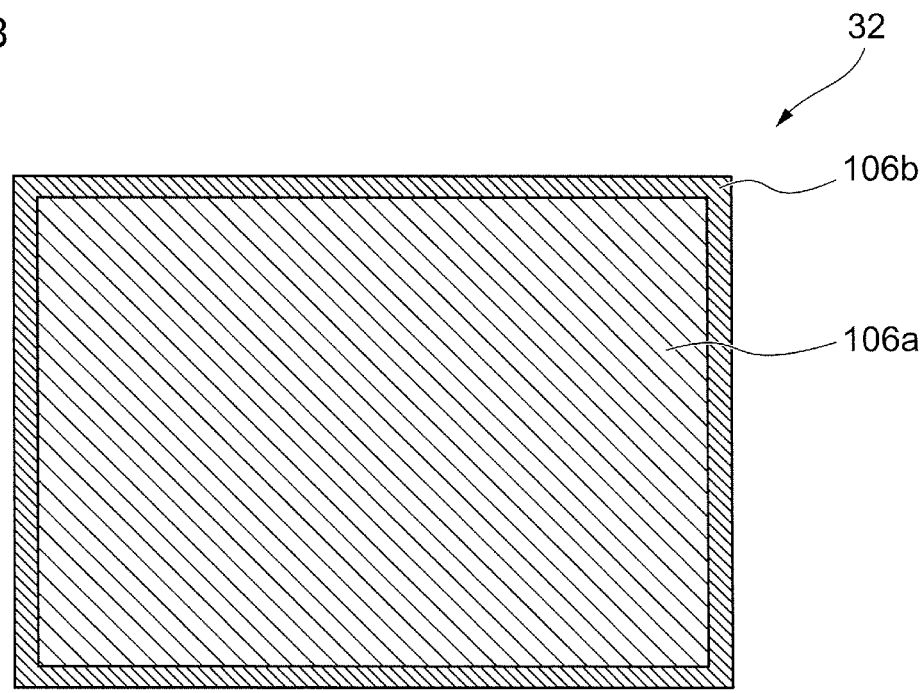

FIGS. 10A and 10B illustrate configurations of the conductor portion 106 and the connecting portion 32 according to another embodiment. FIG. 10A is a cross-sectional view of the sensitive element 31, corresponding to a cross-sectional view along the line IIA-IIA in FIG. 1A. FIG. 10B is a cross-sectional view of the connecting portion 32, corresponding to a cross-sectional view along the line IIB-IIB in FIG. 1A.

As shown in FIG. 10A, the conductor portion 106 of the sensitive element 31 may include the diffusion inhibiting layer 106b that is laminated around the perimeter of the conductor layer 106a centered about the longitudinal axis thereof. In other words, the conductor portion 106 may include the diffusion inhibiting layer 106b that is laminated not only on the top and bottom faces of the conductor layer 106a but also on side faces thereof connecting the top and bottom faces.

This further inhibits contact between the soft magnetic material layer 105 and the conductor layer 106a of the conductor portion 106 constituting the sensitive element 31, further inhibiting diffusion of the metal constituting the conductor layer 106a into the soft magnetic material layer 105.

Likewise, as shown in FIG. 10B, the connecting portion 32 may include the diffusion inhibiting layer 106b that is laminated not only on the top and bottom faces of the conductor layer 106a but also on side faces thereof connecting the top and bottom faces. This inhibits exposure of the metal constituting the conductor layer 106a to air, further inhibiting oxidation of the metal constituting the conductor layer 106a.

As described above, the sensitive element 31 of the magnetic sensor 1 of the present embodiment includes the soft magnetic material layer 105 having the longitudinal and transverse directions and the conductor layer 106a having higher conductivity than the soft magnetic material layer 105 and extending through the soft magnetic material layer 105 in the longitudinal direction. This inhibits the formation, within the soft magnetic material layer 105, of a closure magnetic domain with plural magnetic domains collectively having a circular magnetization orientation, and thus reduces or inhibits a decrease in the SN ratio at the output from the magnetic sensor 1.

Additionally, in the magnetic sensor 1 of the present embodiment, each connecting portion 32 connecting the plural sensitive elements 31 is continuous with the conductor portion 106 (conductor layer 106a) of each sensitive element 31. This configuration can reduce the resistance of the sensitive portion 30 as compared to, for example, when the connecting portion 32 is discontinuous with the conductor portion 106 and made of a material different from that of the conductor portion 106. This, in turn, can improve the sensitivity of the magnetic sensor 1.

While some embodiments of the present invention have been described herein, the present invention is not limited to these embodiments. Various modifications and combinations may be made without departing from the sprit and scope of the present invention.

REFERENCE SIGNS LIST

1 Magnetic sensor
10 Substrate
20 Thin-film magnet
30 Sensitive portion
31 Sensitive element
32 Connecting portion
33 Terminal portion
40, 40a, 40b Yoke
101 Adhesive layer
102 Control layer
103 Hard magnetic material layer
104 Dielectric layer
105 Soft magnetic material layer
106 Conductor portion
106a Conductor layer
106b Diffusion inhibiting layer

The invention claimed is:
1. A magnetic sensor comprising:
a plurality of sensitive elements, each of the plurality of sensitive elements comprising a soft magnetic material layer having a longitudinal direction and a transverse direction and a conductor layer having higher conductivity than the soft magnetic material layer and extending through the soft magnetic material layer in the longitudinal direction, each of the plurality of sensitive elements having uniaxial magnetic anisotropy in a direction intersecting the longitudinal direction, each of the plurality of sensitive elements being configured to sense a magnetic field by a magnetic impedance effect; and a connecting portion continuous with the conductor layer of one of the plurality of sensitive elements and configured to connect transversely adjacent ones of the plurality of sensitive elements in series, wherein each of the plurality of sensitive elements further comprises a diffusion inhibiting layer between the conductor layer and the soft magnetic material layer, the diffusion inhibiting layer being configured to inhibit diffusion of elements between the conductor layer and the soft magnetic material layer, and wherein the connecting portion comprises a connecting conductor layer and a connecting diffusion inhibiting layer, the connecting conductor layer being continuous with the conductor layer of the one of the plurality of sensitive elements, the connecting diffusion inhibiting layer being continuous with the diffusion inhibiting layer of the one of the plurality of sensitive elements.

2. The magnetic sensor according to claim 1, wherein the soft magnetic material layer of each of the plurality of sensitive elements is formed with a magnetic domain having magnetization oriented in a circumferential direction centered about the conductor layer.

3. The magnetic sensor according to claim 1, wherein the diffusion inhibiting layer of each of the plurality of sensitive elements is disposed around a perimeter of the conductor layer centered about an axis of the longitudinal direction.

4. The magnetic sensor according to claim 2, wherein the diffusion inhibiting layer of each of the plurality of sensitive elements is disposed around a perimeter of the conductor layer centered about an axis of the longitudinal direction.

5. A method for manufacturing a magnetic sensor, the method comprising:

forming a plurality of first soft magnetic material portions using a soft magnetic material, each of the plurality of first soft magnetic material portions being strip-shaped and having a longitudinal direction and a transverse direction;

concurrently forming a plurality of conductor portions and a connecting portion using a material with higher conductivity than the soft magnetic material, the plurality of conductor portions being formed on respective ones of the plurality of first soft magnetic material portions so as to extend in the longitudinal direction, the connecting portion being configured to connect adjacent ones of the plurality of conductor portions; and forming a plurality of second soft magnetic material portions using the soft magnetic material, the plurality of second soft magnetic material portions being formed above respective ones of the plurality of first soft magnetic material portions so as to cover respective ones of the plurality of conductor portions, wherein each of the plurality of conductor portions and the connecting portion are formed by sequential deposition of a conductor layer and a diffusion inhibiting layer, the conductor layer having higher conductivity than the soft magnetic material, the diffusion inhibiting layer being configured to inhibit diffusion of elements between the conductor layer and the soft magnetic material, and wherein the connecting portion comprises a connecting conductor layer and a connecting diffusion inhibiting layer, the connecting conductor layer being continuous with the conductor layer of the one of the plurality of sensitive elements, the connecting diffusion inhibiting layer being continuous with the diffusion inhibiting layer of the one of the plurality of sensitive elements.

* * * * *